(12) United States Patent
Que et al.

(10) Patent No.: US 10,996,107 B2
(45) Date of Patent: May 4, 2021

(54) EXPONENTIAL MODEL BASED UNCOOLED INFRARED FOCAL PLANE ARRAY READOUT CIRCUIT

(71) Applicant: University of Electronic Science and Technology of China, Chengdu (CN)

(72) Inventors: Longcheng Que, Chengdu (CN); Daogang Min, Chengdu (CN); Kai Yang, Chengdu (CN); Yi Zhang, Chengdu (CN); Jian Lv, Chengdu (CN); Yun Zhou, Chengdu (CN); Yadong Jiang, Chengdu (CN)

(73) Assignee: University of Electronic Science and Technology of China, Chengdu (CN)

( * ) Notice: Subject to any disclaimer, the term of this patent is extended or adjusted under 35 U.S.C. 154(b) by 31 days.

(21) Appl. No.: 16/577,127

(22) Filed: Sep. 20, 2019

(65) Prior Publication Data
US 2021/0048340 A1    Feb. 18, 2021

(30) Foreign Application Priority Data
Aug. 12, 2019  (CN) .......................... 201910739319.9

(51) Int. Cl.
*G01J 1/44*  (2006.01)
*G01J 5/28*  (2006.01)
(Continued)

(52) U.S. Cl.
CPC . *G01J 1/44* (2013.01); *G01J 5/28* (2013.01); *H01L 31/024* (2013.01); *H04N 5/33* (2013.01)

(58) Field of Classification Search
CPC .. G01J 1/44; G01J 5/28; H01L 31/024; H04N 5/33
See application file for complete search history.

(56) References Cited

U.S. PATENT DOCUMENTS

| 10,323,987 B2 | 6/2019 | Kangas et al. |
| 2015/0192472 A1* | 7/2015 | Lv .............................. G01J 5/10 |
| | | 250/338.1 |

FOREIGN PATENT DOCUMENTS

| CN | 103900722 A | 7/2014 |
| CN | 107515050 A | 12/2017 |
| CN | 108449062 A | 8/2018 |

OTHER PUBLICATIONS

Office Action issued in corresponding Chinese Application No. 201910739319.9, dated Mar. 13, 2020.
(Continued)

*Primary Examiner* — Mark R Gaworecki
(74) *Attorney, Agent, or Firm* — Westman, Champlin & Koehler, P.A.

(57) ABSTRACT

The present disclosure relates to an exponential model based uncooled infrared focal plane array readout circuit, including: a first microbolometer unit and a second microbolometer unit, for obtaining a detection signal and a reference signal; a conversion unit, connected with the first and second microbolometer units, and configured for converting the detection signal and reference signal to obtain a linear detection signal and linear reference signal; a subtraction unit, connected with the conversion unit, and configured for calculating a difference between the detection signal and the reference ratio signal to obtain a difference signal; and an integration unit, connected to the subtraction unit, and configured for integrating the difference signal to obtain an electrical signal for characterizing the infrared light signal of the to-be-detected object.

7 Claims, 4 Drawing Sheets

(51) Int. Cl.
H01L 31/024 (2014.01)
H04N 5/33 (2006.01)

(56) References Cited

OTHER PUBLICATIONS

Longcheng Que, "Research on Integrated Design and Crucial Technology for Uncooled Infrared Focal Plane Detector Chip", A Doctoral Dissertation Submitted to University of Electronic Science and Technology of China, May 2016.

* cited by examiner

EXPONENTIAL MODEL BASED UNCOOLED INFRARED FOCAL PLANE ARRAY READOUT CIRCUIT

CROSS-REFERENCE TO RELATED APPLICATION(S)

This application claims priority to Chinese application number 201910739319.9, filed Aug. 12, 2019, with a title of EXPONENTIAL MODEL BASED UNCOOLED INFRARED FOCAL PLANE ARRAY READOUT CIRCUIT. The above-mentioned patent application is incorporated herein by reference in its entirety.

TECHNICAL FIELD

The present invention relates to the field of infrared focal plane technologies, and in particular, to an exponential model based uncooled infrared focal plane array readout circuit.

BACKGROUND

An uncooled infrared focal plane array detector has a wide range of applications in military, industrial, medical, scientific research and other fields, the most representative of which is a microbolometer; the microbolometer is a light-heat-electric type infrared detector; an array of the detector receives infrared radiation to cause a change in the temperature of the microbolometer, which leads to a change in the equivalent resistance of the microbolometer; a readout circuit of the infrared microbolometer is a special circuit for reading a change value of the equivalent resistance of the microbolometer and obtaining infrared radiation information of a corresponding target.

Objects of different temperatures emit infrared rays of different wavelengths, causing pixels on a focal plane array of the detector to exhibit different resistance values.

As a kind of thermal infrared detector, the microbolometer relates its detection result to a substrate temperature if no special compensation method is used. In practical use, it is hoped that the infrared detection result is only related to the temperature of the detection target, and has nothing to do with other factors.

Since the temperature is increased after the pixels receive infrared radiation, the change in the substrate temperature will cause a great non-uniformity in the focal plane array, which affects the reading result. Through continuous research, it is found that the key technologies for solving the non-uniformity of the uncooled infrared focal plane array detector are: on the one hand, the improvement of the process, on the other hand, the design of a readout circuit with a non-uniformity correction function, thereby realizing non-uniformity compensation through the circuit, and outputting a good quality image.

For a traditional structure realizing non-uniformity compensation through a circuit, since temperature rise caused by a target temperature is often a relatively small variable, an equivalent resistance of an exponential model based microbolometer is subjected to a first-order Taylor expansion, a first-order small quantity is retained, fit and approximated into a linearly changing resistance, and subsequent substrate temperature compensation is performed to eliminate the non-uniformity. However, the resistance model linearly changing with temperature can only meet the relationship that the equivalent resistance of the microbolometer changes with the temperature in a certain temperature range, and if it exceeds the certain temperature range, it will bring a large error.

SUMMARY

The present invention can provide an exponential model based uncooled infrared focal plane array readout circuit, which avoids the effect of a substrate temperature, and has low circuit noise, and high adaptability.

Embodiments of the present invention provide an exponential model based uncooled infrared focal plane array readout circuit, including:

a first microbolometer unit, configured for detecting an infrared light signal of a to-be-detected object to obtain a detected radiation signal;

a second microbolometer unit, configured for obtaining a reference signal according to a resistance thereof;

a conversion unit, respectively connected to the first microbolometer unit and the second microbolometer unit, and configured for generating a detection signal according to the detected radiation signal and generating a reference ratio signal according to the reference signal;

a subtraction unit, connected to the conversion unit, and configured for calculating a difference between the detection signal and the reference ratio signal to obtain a difference signal; and an integration unit, connected to the subtraction unit, and configured for integrating the difference signal to obtain an electrical signal for characterizing the infrared light signal of the to-be-detected object.

Preferably, the conversion unit includes:

a first detection circuit, connected to the first microbolometer unit, and configured for biasing the detected radiation signal to obtain a first detection signal;

a second detection circuit, connected to the second microbolometer unit, and configured for biasing the reference signal to obtain a first detection ratio signal;

a first logarithmic subtraction circuit, connected to the first detection circuit, and configured for performing a logarithmic subtraction on the first detection signal and a first built-in reference voltage signal to obtain a second detection signal;

a second logarithmic subtraction circuit, connected to the second detection circuit, and configured for performing a logarithmic subtraction on the second detection signal and a second built-in reference voltage signal to obtain a second reference ratio signal;

a first inverse ratio circuit, connected to the first logarithmic subtraction circuit, and configured for inversely calculating the second detection signal to obtain a third detection signal, the third detection signal being the detection signal; and a second inverse ratio circuit, connected to the second logarithmic subtraction circuit, and configured for inversely calculating the second reference ratio signal to obtain a third reference ratio signal, the third reference ratio signal being the reference ratio signal.

Preferably, the conversion unit further includes:

a first buffer circuit, disposed between the first detection circuit and the first logarithmic subtraction circuit; and a second buffer circuit, disposed between the second detection circuit and the second logarithmic subtraction circuit.

Preferably, the exponential model based uncooled infrared focal plane array readout circuit further includes:

a first constant current source, disposed between the first detection circuit and the first microbolometer unit; and a second constant current source, disposed between the second detection circuit and the second microbolometer unit.

Preferably, the first microbolometer unit and the second microbolometer unit both are exponential model resistors.

Preferably, the first microbolometer unit adopts a silicon insulated substrate.

Preferably, the exponential model based uncooled infrared focal plane array readout circuit further includes:

a shading component, configured for completely shading the second microbolometer unit, such that the second microbolometer unit is unaffected by infrared radiation.

Preferably, the difference signal is integrated to obtain the electrical signal, specifically:

$$V_{out} = V_{ref} + \frac{1}{C_{int}} \int_0^{t_{int}} \frac{V_{ref} - \frac{R_f}{R_1} \frac{V_{ref2}}{I_s R_x} \frac{K_B \Delta T_{scene}}{E_a}}{R_{int}} = V_{ref} + K \Delta T_{scene}$$

where $V_{ref}$ is a reference level of the integration unit, $C_{int}$ is an integral capacitance of the integration unit, $R_{int}$ is an integral resistance of the integration unit, $t_{int}$ is an integration time of the integration unit, $R_f$ and $R_1$ are resistance values of the subtraction units, $R_X$ is a resistance value of the inverse ratio circuits, $V_{ref2}$ is a reference level of the inverse ratio circuits, $E_a$ is activation energy, $K_B$ is a Boltzmann constant, $I_s$ is a saturation current of a bipolar junction transistor, $\Delta T_{scene}$ is a temperature rise due to infrared radiation, and K is an integral coefficient.

According to specific embodiments provided in the present invention, the present invention discloses the following technical effects:

the present invention performs biasing, conversion and operation on a to-be-detected infrared light signal of a to-be-detected object and a reference signal by a first microbolometer unit, a second microbolometer unit, a conversion unit, a subtraction unit and an integration unit, thereby eliminating the effect of a substrate temperature, reducing the noise of the entire circuit, and thus outputting a more precise electrical signal of infrared light of the to-be-detected object.

BRIEF DESCRIPTION OF THE DRAWINGS

To describe the technical solutions in the embodiments of the present invention or in the prior art more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

Description of symbols: 1. Conversion circuit, 2. First microbolometer unit, 3. Second microbolometer unit, 4. Subtraction unit, 5. Integration unit, 11. First detection circuit, 12. Second detection circuit, 13. First logarithmic subtraction circuit, 14. Second logarithmic subtraction circuit, 15. First inverse ratio circuit, 16. First inverse ratio circuit.

DETAILED DESCRIPTION

The following describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

The present invention can provide an exponential model based uncooled infrared focal plane array readout circuit, which avoids the effect of a substrate temperature, and has low circuit noise, an accurate reference circuit and high adaptability.

To make features and advantages of the present invention clearer and more comprehensible, the present invention is further described in detail below with reference to the accompanying drawings and specific embodiments.

Figure 1:
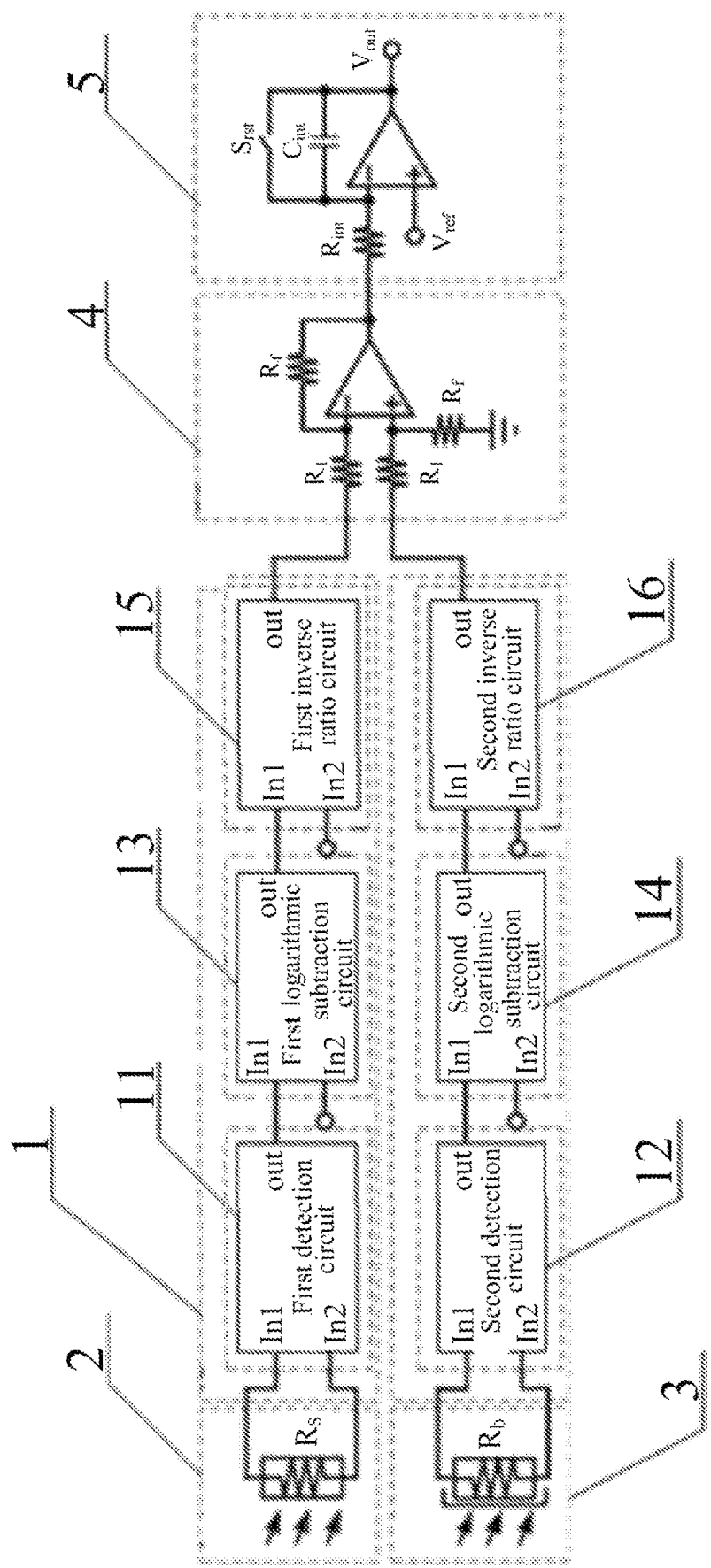
FIG. 1 is a structural diagram of an exponential model based uncooled infrared focal plane array readout circuit according to the present invention.

As shown in FIG. 1, an exponential model based uncooled infrared focal plane array readout circuit according to the present invention includes a first microbolometer unit 2, a second microbolometer unit 3, a conversion unit 1, a subtraction unit 4 and an integration unit 5.

The first microbolometer unit 2 is configured for detecting an infrared light signal of a to-be-detected object to obtain a detected radiation signal. In the present embodiment, the first microbolometer unit 2 is an exponential model resistor.

The second microbolometer unit 3 is configured for obtaining a reference signal according to a resistance thereof. In the present embodiment, the second microbolometer unit 3 is an exponential model resistor.

The conversion unit 1 is respectively connected to the first microbolometer unit 2 and the second microbolometer unit 3, and configured for generating a detection signal according to the detected radiation signal and generating a reference ratio signal according to the reference signal.

The subtraction unit 4 is connected to the conversion unit 1, and configured for calculating a difference between the detection signal and the reference ratio signal to obtain a difference signal.

The integration unit 5 is connected to the subtraction unit 4, and configured for integrating the difference signal to obtain an electrical signal for characterizing the infrared light signal of the to-be-detected object.

Specifically, the infrared light of the to-be-detected object illuminates the first microbolometer unit 2 to change the resistance value of the first microbolometer unit 2.

The second microbolometer unit 3 doesnotreceive the infrared radiation, so that the resistance value of the second microbolometer unit 3 remains unchanged.

In order that the change in the resistance value of the first microbolometer 2 is unaffected by a change in its own temperature, a substrate of the first microbolometer 2 is a silicon insulated substrate.

In order to prevent the second microbolometer unit 3 from being affected by other infrared light, the exponential model based uncooled infrared focal plane array readout circuit is further provided with a shading device, which is configured for completely shading the second microbolometer unit 3, such that the resistance value of the second microbolometer unit 3 is unaffected by infrared radiation. Preferably, a substrate of the second microbolometer unit 3 is a silicon insulated substrate.

Preferably, the exponential model based uncooled infrared focal plane array readout circuit according to the present invention further includes:

a first constant current source, disposed between the conversion unit 1 and the first microbolometer unit 2; and a second constant current source, disposed between the conversion unit 1 and the second microbolometer unit 3.

Specifically, the conversion unit 2 includes a first detection circuit 11, a second detection circuit 12, a first logarithmic subtraction circuit 13, a second logarithmic subtraction circuit 14, a first inverse ratio circuit 15, and a second inverse ratio circuit 16.

The first detection circuit 11 is connected to the first microbolometer unit 2 through the first constant current source, and the first detection circuit 11 biases the first microbolometer unit 2 through the first constant current source, and obtains an exponential type voltage signal generated on the first microbolometer unit 2, thereby obtaining a first detection signal.

The second detection circuit 12 is connected to the second microbolometer unit 3 through the second constant current source, and the second detection circuit 12 biases the second microbolometer unit 3 through the second constant current source, and obtains an exponential voltage signal generated on the second microbolometer unit 3, thereby obtaining a first reference ratio signal.

Figure 2:
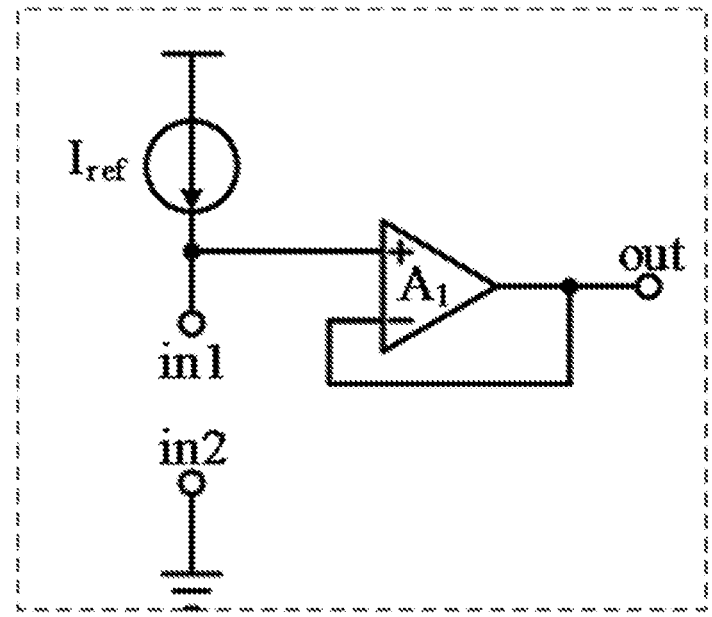
FIG. 2 is a structural diagram of a first detection circuit and a second detection circuit in an exponential model based uncooled infrared focal plane array readout circuit according to the present invention.

Specifically, the first detection circuit 11 and the second detection circuit 12 both are circuits shown in FIG. 2.

The first logarithmic subtraction circuit 13 is connected to the first detection circuit 11, and configured for performing a logarithmic subtraction on the first detection signal and a first built-in reference voltage signal to obtain a second detection signal; specifically, the first logarithmic subtraction circuit 13 performs a logarithmic operation and a subtraction on the first detection signal and the first built-in reference voltage signal to obtain a second detection signal.

The second logarithmic subtraction circuit 14 is connected to the second detection circuit 12, and configured for performing a logarithmic subtraction on the second detection signal and a second built-in reference voltage signal to obtain a second reference ratio signal; specifically, the second logarithmic subtraction circuit 14 performs a logarithmic operation and a subtraction on the second detection signal and the second built-in reference voltage signal to obtain a second reference ratio signal.

In order to prevent the first detection signal and the first reference ratio signal from being subsequently affected by the circuit, the conversion unit further includes a first buffer circuit and a second buffer circuit.

The first buffer circuit is disposed between the first detection circuit 11 and the first logarithmic subtraction circuit 13; the second buffer circuit is disposed between the second detection circuit 12 and the second logarithmic subtraction circuit 14.

The first inverse ratio circuit 15 is connected to the first logarithmic subtraction circuit 13, and configured for inversely calculating the second detection signal to obtain a third detection signal that linearly changes with temperature, the third detection signal being the detection signal. The second inverse ratio circuit 16 is connected to the second logarithmic subtraction circuit 14, and configured for inversely calculating the second reference ratio signal to obtain a third reference ratio signal that linearly changes with temperature, the third reference ratio signal being the reference ratio signal.

Preferably, the subtraction unit calculates a difference between the third detection signal and the third reference ratio signal to eliminate the effect of the substrate temperature, thereby obtaining a difference signal that does not change with the substrate temperature.

Specifically, the specific formula by which the integration circuit integrates the difference signal to obtain the electrical signal is:

$$V_{out} = V_{ref} + \frac{1}{C_{int}} \int_0^{t_{int}} \frac{V_{ref} - \frac{R_f}{R_1} \frac{V_{ref2}}{I_s R_x} \frac{K_B \Delta T_{scene}}{E_a}}{R_{int}} = V_{ref} + K \Delta T_{scene}$$

where $V_{ref}$ is a reference level of the integration unit, $C_{int}$ is an integral capacitance of the integration unit, $R_{int}$ is an integral resistance of the integration unit, $t_{int}$ is an integration time of the integration unit, $R_f$ and $R_1$ are resistance values of the subtraction units, $R_X$ is a resistance value of the inverse ratio circuits, $V_{ref2}$ is a reference level of the inverse ratio circuits, $E_a$ is activation energy, $K_B$ is a Boltzmann constant, $I_s$ is a saturation current of a bipolar junction transistor, $\Delta T_{scene}$ is a temperature rise due to infrared radiation, and K is an integral coefficient.

The characterizing electrical signal $V_{out}$ and the substrate temperature $T_{sub}$ are derived to obtain:

$$\frac{\partial V_{out}}{\partial T_{sub}} = 0$$

it shows that the characterizing electrical signal obtained by the readout circuit of the present invention is unaffected by the substrate temperature of the first microbolometer unit 2.

Figure 3:
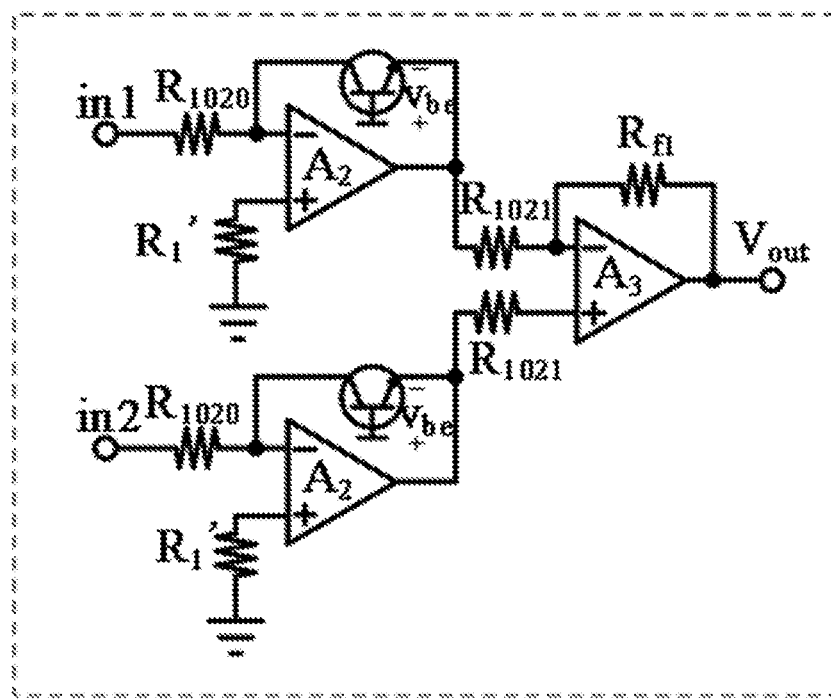
FIG. 3 is a structural diagram of a first logarithmic subtraction circuit and a second logarithmic subtraction circuit in an exponential model based uncooled infrared focal plane array readout circuit according to the present invention.

Specifically, the first logarithmic subtraction circuit 13 and the second logarithmic subtraction circuit 14 both are circuits shown in FIG. 3; an input end in1 of the first logarithmic subtraction circuit 13 is connected to an output end of the first detection circuit 11, and an input end in2 of the first logarithmic subtraction circuit 13 is connected to the first built-in reference voltage signal; an input end in1 of the second logarithmic subtraction circuit 14 is connected to an output end of the second detection circuit 12, and an input end in2 of the second logarithmic subtraction circuit 14 is connected to the second built-in reference voltage signal.

Figure 4:
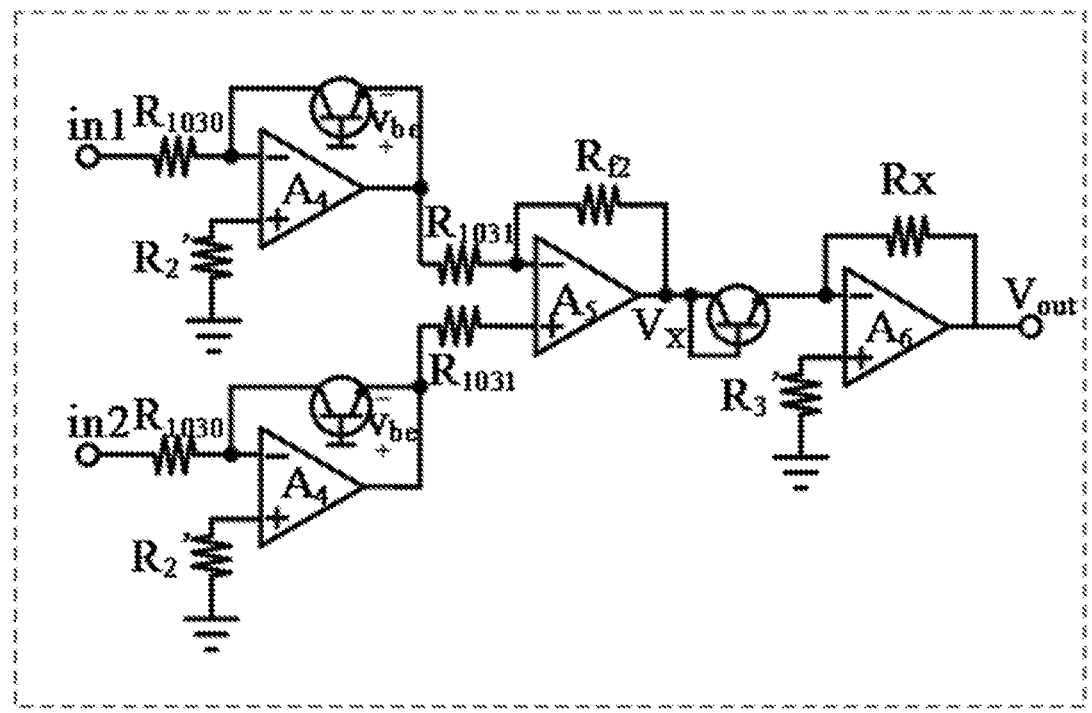
FIG. 4 is a structural diagram of a first inverse ratio circuit and a second inverse ratio circuit in an exponential model based uncooled infrared focal plane array readout circuit according to the present invention.

The first inverse ratio circuit 15 and the second inverse ratio circuit 16 both are circuits shown in FIG. 4; an input end in1 of the first inverse ratio circuit 15 is connected to a third built-in reference voltage signal, and an input end in2 of the first inverse ratio circuit 15 is connected to an output end of the first logarithmic subtraction circuit 13; an input end in1 of the second inverse ratio circuit 16 is connected to a fourth built-in reference voltage signal, and an input end in2 of the second inverse ratio circuit 16 is connected to an output end of the second logarithmic subtraction circuit 14.

Specifically, the first built-in reference voltage signal and the second built-in reference voltage signal are the same, and the third built-in reference voltage signal and the fourth built-in reference voltage signal are the same.

Figure 5:
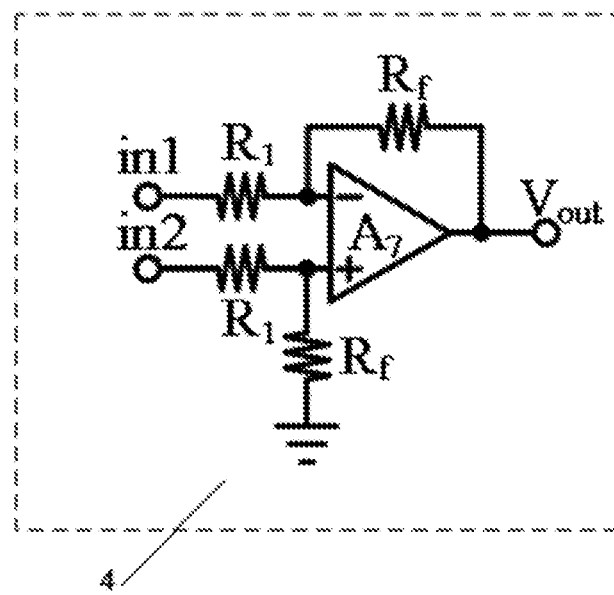
FIG. 5 is a structural diagram of a subtraction unit in an exponential model based uncooled infrared focal plane array readout circuit according to the present invention.

As shown in FIG. 5, an input end in1 of the subtraction unit 4 is connected to an output end of the first inverse ratio circuit 15, and an input end in2 of the subtraction unit 4 is connected to an output end of the second inverse ratio circuit 16.

Figure 6:
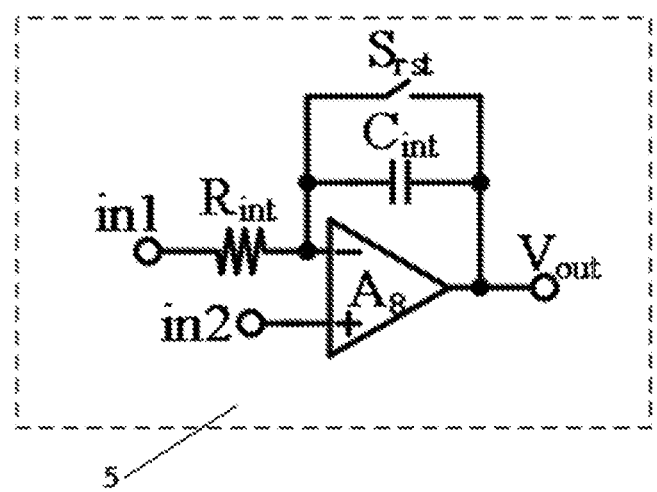
FIG. 6 is a structural diagram of an integration unit in an exponential model based uncooled infrared focal plane array readout circuit according to the present invention.

As shown in FIG. 6, an input end in1 of the integration unit 5 is connected to an output end of the subtraction unit 4, and an input end in 2 of the integration unit 5 is connected to a built-in reference level of the integration unit 5.

In disclosed embodiments, the first microbolometer unit 2 and the second microbolometer unit 3 both adopt the silicon insulated substrate, the conversion unit 1 obtains the detection signals and the reference ratio signals that linearly change with temperature, the subtraction unit 4 obtains the difference signals that do not change with temperature, and thus finally, the electrical signal is unaffected by the substrate and a bias current; and as the first microbolometer unit 2 and the second microbolometer unit 3 of the present invention both are exponential model resistors, the readout circuit can adapt to a harsh environment and has great practicability.

Each embodiment of the present specification is described in a progressive manner, each embodiment focuses on the difference from other embodiments, and the same and similar parts between the embodiments may refer to each other.

Several examples are used for illustration of the principles and implementation methods of the present invention. The description of the embodiments is used to help illustrate the method and its core principles of the present invention. In addition, those skilled in the art can make various modifications in terms of specific embodiments and scope of application in accordance with the teachings of the present invention. In conclusion, the content of this specification shall not be construed as a limitation to the invention.

What is claimed is:

1. An exponential model based uncooled infrared focal plane array readout circuit, comprising:
    a first microbolometer unit, configured for detecting an infrared light signal of a to-be-detected object to obtain a detected radiation signal;
    a second microbolometer unit, configured for obtaining a reference signal according to a resistance thereof;
    a conversion unit, respectively connected to the first microbolometer unit and the second microbolometer unit, and configured for generating a detection signal according to the detected radiation signal and generating a reference ratio signal according to the reference signal;
    a subtraction unit, connected to the conversion unit, and configured for calculating a difference between the detection signal and the reference ratio signal to obtain a difference signal; and
    an integration unit, connected to the subtraction unit, and configured for integrating the difference signal to obtain an electrical signal for characterizing the infrared light signal of the to-be-detected object,
    wherein the first microbolometer unit and the second microbolometer unit both are exponential model resistors.

2. The exponential model based uncooled infrared focal plane array readout circuit according to claim 1, wherein the conversion unit comprises:
    a first detection circuit, connected to the first microbolometer unit, and configured for biasing the detected radiation signal to obtain a first detection signal;
    a second detection circuit, connected to the second microbolometer unit, and configured for biasing the reference signal to obtain a first detection ratio signal;
    a first logarithmic subtraction circuit, connected to the first detection circuit, and configured for performing a logarithmic subtraction on the first detection signal and a first built-in reference voltage signal to obtain a second detection signal;
    a second logarithmic subtraction circuit, connected to the second detection circuit, and configured for performing a logarithmic subtraction on the second detection signal and a second built-in reference voltage signal to obtain a second reference ratio signal;
    a first inverse ratio circuit, connected to the first logarithmic subtraction circuit, and configured for inversely calculating the second detection signal to obtain a third detection signal, the third detection signal being the detection signal; and
    a second inverse ratio circuit, connected to the second logarithmic subtraction circuit, and configured for inversely calculating the second reference ratio signal to obtain a third reference ratio signal, the third reference ratio signal being the reference ratio signal.

3. The exponential model based uncooled infrared focal plane array readout circuit according to claim 2, wherein the conversion unit further comprises:
    a first buffer circuit, disposed between the first detection circuit and the first logarithmic subtraction circuit; and
    a second buffer circuit, disposed between the second detection circuit and the second logarithmic subtraction circuit.

4. The exponential model based uncooled infrared focal plane array readout circuit according to claim 2, wherein the exponential model based uncooled infrared focal plane array readout circuit further comprises:
    a first constant current source, disposed between the first detection circuit and the first microbolometer unit; and
    a second constant current source, disposed between the second detection circuit and the second microbolometer unit.

5. The exponential model based uncooled infrared focal plane array readout circuit according to claim 2, wherein the difference signal is integrated to obtain the electrical signal, specifically:

$$V_{out} = V_{ref} + \frac{1}{C_{int}} \int_0^{t_{int}} \frac{V_{ref} - \frac{R_f}{R_1} \frac{V_{ref2}}{I_s R_x} \frac{K_B \Delta T_{scene}}{E_a}}{R_{int}} = V_{ref} + K \Delta T_{scene}$$

wherein $V_{ref}$ is a reference level of the integration unit, $C_{int}$ is an integral capacitance of the integration unit, $R_{int}$ is an integral resistance of the integration unit, $t_{int}$ is an integration time of the integration unit, $R_f$ and $R_1$ are resistance values of the subtraction units, $R_x$ is a resistance value of the inverse ratio circuits, $V_{ref2}$ is a reference level of the first and second inverse ratio circuits, $E_a$ is activation energy, $K_B$ is a Boltzmann constant, $I_s$ is a saturation current of a bipolar junction transistor, $\Delta T_{scene}$ is a temperature rise due to infrared radiation, and K is an integral coefficient.

6. The exponential model based uncooled infrared focal plane array readout circuit according to claim 1, wherein a substrate of the first microbolometer unit is a silicon insulated substrate.

7. The exponential model based uncooled infrared focal plane array readout circuit according to claim 1, wherein the exponential model based uncooled infrared focal plane array readout circuit further comprises:
   a shading component, configured for completely shading the second microbolometer unit, such that the second microbolometer unit is unaffected by infrared radiation.

* * * * *